United States Patent [19]
Costa et al.

[11] Patent Number: 5,150,369
[45] Date of Patent: Sep. 22, 1992

[54] HIGH-SPEED CONVOLUTIONAL DECODER

[76] Inventors: Tony M. Costa, 81 Seeley Ave., Kearny, N.J. 07032; Robert Resuta, 225 Charlotte Ave., S. Bound Brook, N.J. 08880

[21] Appl. No.: 365,845

[22] Filed: Jun. 13, 1989

[51] Int. Cl.$^5$ .................. G06F 11/10; H03M 13/12
[52] U.S. Cl. ............................................. 371/43
[58] Field of Search ............................. 371/43, 44, 45

[56] References Cited

U.S. PATENT DOCUMENTS

| | | | |
|---|---|---|---|
| 3,789,360 | 2/1974 | Clark, Jr. et al. | 371/43 |
| 3,842,400 | 10/1974 | Liefeld et al. | 371/43 |
| 4,500,994 | 2/1985 | McCallister et al. | 371/43 |
| 4,536,878 | 8/1985 | Rattlingourd et al. | 371/43 |
| 4,742,533 | 5/1988 | Weidner et al. | 371/43 |
| 4,823,346 | 4/1989 | Kobayashi et al. | 371/43 |
| 4,932,029 | 6/1990 | Heichler | 371/43 |

Primary Examiner—Jerry Smith
Assistant Examiner—Phung Chung
Attorney, Agent, or Firm—Robin, Blecker, Daley & Driscoll

[57] ABSTRACT

A convolutional decoder for decoding a received message of digital data convolutionally encoded at a constraint length of K, comprises branch metric calculating circuitry for receiving the data and providing output signals indicative of the branch metrics therefor, a plurality of $2^{K-1}$ circuits for receiving the output signals and computing state metrics, the circuits being interconnected to form a trellis and generating decision bits and a plurality of $2^{K-1}$ memory circuits, the memory circuits being interconnected also to form a trellis and responsive to the decision bits to output a decoded digit of the received message data.

15 Claims, 5 Drawing Sheets 5,150,369

HIGH-SPEED CONVOLUTIONAL DECODER

FIELD OF THE INVENTION

This invention relates generally to error-correcting codes for digital communication systems and pertains more particularly to an improved implementation of a convolutional decoder for such systems.

BACKGROUND OF THE INVENTION

In the transmission of digital data, streams of data bits are frequently subject to noise and like environmental impact which degrades the transmission at the point of its receipt, with resulting loss of some of the transmitted message. The art has long looked to various measures for transmitting the message data with error-correction data, such that the message data may be reconstructed in the receiver and noise-impacted message data may be recovered.

One measure for error-correction employs redundant codes of convolutional type. At the point of encoding the message data for transmission, plural digits (code symbols) are created for each digit of the message data. In creating the code symbols, the choice of symbols selected to represent an input digit of the message data is affected not only by the input digit itself, but also by preceding digits of the message data. Given such order, reconstruction is enabled in the receiver.

This practice gives rise to data "states" in the transmitted and received messages, i.e., a code situation in which each possible sequence of future data immediately following that state is decoded in a particular predetermined manner. FIG. 1 herein is taken from U.S. Pat. No. 3,789,360 and shows a "tree" of possible code data sequences for a short segment of convolutional code having a rate of two, i.e., two code symbols are generated for each digit of message data. In this tree, a path is followed dependently on the value of message digits. From any node, an upper path is taken when the message digit being encoded is zero and a lower path is taken when the message digit being encoded is one.

Four states are identified in FIG. 1 by the numerals in the square boxes at the tree nodes. For each state, rightward progress from any node correspondingly numbered is the same. Predictable in accordance with the code of the FIG. 1 tree, are the two ways in which each state can be entered and the two ways in which the state can be left. The transition from one state to another, as by the encoding of a succeeding message digit is termed a "branch interval". "State metrics" are derivable for each state and "branch metrics" are derivable for each branch interval.

A "trellis" is typically constructed, identifying the possible data sequences in terms of data states. From the trellis, "survivor sequences" or paths are determinable and correlations are computed for selecting the paths which are to survive. A circuit implementation of a trellis connection computer is shown in FIG. 6 of the '360 patent. The functions implemented in such computer involve an initial processing simultaneously in four correlators of the latest received branch data with a data pattern which each correlator is prewired to represent, i.e., one of the four possible state values (00, 11, 01 and 10). The result of each correlation (branch metric) is applied to a pair of adders, one for each of the two states which can be entered by means of convolution data for which that correlator is prewired. Stored values of prior path cumulative correlations (state metrics) are also applied to the adders. The adder outputs represent the cumulative correlations for each of the two paths by which the state may be left. A comparator is provided for each state for effecting a comparison of outputs of the two adders of that state. On the basis of the result of the comparison, one of the two outputs is selected as the survivor path and becomes the updated state metric for use in the next cycle for the adders of that state.

The outputs of the four state comparators are furnished as trellis connection data. Further, a four-input comparator receives and compares the cumulative correlations of the four survivor paths to select the survivor path having the highest cumulative to be the sole survivor.

By way of introduction to the invention to be detailed below, certain commonality in function with that above discussed is involved. Thus, a function of controlled encoding with a preselected convolutional code is employed, as in the '360 patent. A function of branch metric calculations is likewise involved and practiced on each interval of received data. An add, compare and select is also performed by the use of current branch metrics and prior state metrics. As will be seen, however, applicants implement this latter practice in parallel fashion, providing a plurality of add, compare and select circuit elements, each of which furnishes a survivor path selection or decision output. To place this distinction in perspective, it will be helpful to consider what use is made in the '360 patent of the four state comparator output information (which is termed trellis connection data as above noted) and of the sole survivor .oath indication or decision output.

In the '360 patent arrangement, the trellis connection data and sole survivor path indication are passed on seriatim as transmitted digits are received to a switch matrix decoder, a version thereof being seen in FIG. 7 of the '360 patent.

The implementation of the '360 patent switch matrix decoder involves an upper section having a plurality of shift registers, each receiving one of the trellis connection data, i.e., four shift registers. The switch matrix decoder has a lower section having a plurality of switch sets in number corresponding to the number of stages of the shift registers. Each switch set has individual switches corresponding in number to the number of states, i.e., four switches. The states of the switches in each switch set are controlled by the corresponding shift register stage in the upper section of the switch matrix decoder. The sole survivor path indication is connected to the first switch set in the succession and the last switch set in the succession converges on an output gate which furnishes the decoded output bit.

Assuming a steady-state to be at hand, i.e., the shift registers are full of trellis connection data, and a further set of trellis connection data and a further sole survivor path indication to be applied to the switch matrix decoder, the practice of the '360 patent is now to shift in the further trellis connection data and to have all switches set correspondingly to the contents of their counterpart register stages. A trellis path is accordingly established and a tracing back through such path occurs to obtain the decoded output bit.

The '360 approach may thus be characterized as implementing a path memory by using trellis connection data and sole survivor path indications obtained from an add, compare and select unit in conjunction with a hardwired representation of the convolutional encoder's trellis structure and by tracing back through the trellis to determine the correct databit to output.

Accepting that the relays of the '360 patent are high-speed solid-state switches, some delay attends the set-up of the switches upon such further input to the shift registers, i.e., what might be termed a unit of delay. However, there is also present a propagation delay through the switch matrix decoder in tracing back through the survivor trellis path giving rise to the output data.

It is to be recognized that decoder performance is improved as trellis path length is increased. However, in the prior art approach, as in the '360 patent, such improved performance by increase of trellis path length is attended by increased propagation delay through the switch matrix decoder. As a general rule, trellis path length L is desirably more than five or six times the "constraint length" (K) for desired system performance, constraint length being equal to the number of stages in the shift register of the system convolutional encoder. For a constraint length of seven, L is thus desirably forty or more. If each propagation per stage of the trellis path length is one unit of delay, the composite delay for the decoder example under discussion, is forty-one units of delay.

FIG. 2 depicts generally what is seen as the prior art convolutional decoder 110 addressed by the invention. Output data is provided on line 112 responsively to input data on line 114.

Data on line 114 is applied by line 116 to metrics computer 118. Branch metric indication furnished over line 120 to state metrics computer 122. The connection data and signals regarding survivor path indication per branch interval are applied respectively over lines 124 and 126 to switch matrix decoder 128. Decoded bits are applied seriatim on line 130 to output line 112. Delay 132 is experienced through switch matrix decoder 128, the delay corresponding to the above-discussed unit delay for setting up the switches of decoder 128 and the propagation delay attending tracing back through the trellis.

From applicants' viewpoint, the '360 patent convolutional decoder does not meet industry desires for lessened delay and, more particularly, a desire for increased trellis path length without attendant propagation delay.

SUMMARY OF THE INVENTION

The present invention has as its primary object the provision of improved convolutional decoders.

A more particular object of the invention is to provide convolutional decoder system and apparatus with lessened delay attending the output of decoded bits from the point of input of data to be decoded.

A further object of the invention is to provide a convolutional decoder wherein delay therein is independent of trellis path length.

In attaining the foregoing and other objects, the invention provides convolutional decoder system and apparatus which is non-tracing in operation and wherein delay is limited to essentially the aforementioned unit delay and is unaffected by trellis path length.

More particularly, the invention provides a convolutional decoder for decoding a received message which is encoded with constraint length (K) where K is equal to the number of stages in the shift register of the encoder. The decoder employs add, compare and select circuits and path memory elements, to be described below, in number equal to $2^{K-1}$. The add, compare and select circuits are interconnected in manner detailed below to replicate the trellis structure and each such add, compare and select circuit provides updated state metrics for future computations and provides also a decision bit regarding sole survivor path. A path memory unit is comprised of the path memory elements, each being a multiplexed (muxed) register. As in the case of the add, compare and select circuits, the path memory elements are interconnected to replicate the trellis structure. As will be described below, each path memory element is responsive to the decision bit applied thereto to select as its input the contents of one or the other of its associated path memory elements. A decoded output bit is provided upon each input bit and corresponds thereto, thus permitting decoding to occur at only the unit delay, apart from delay attending metrics computation and add, compare and subtract operations, required for selection of the path memory element input.

The foregoing and other objects and features of the invention will be further understood from the following detailed description of a preferred embodiment thereof and from the drawings wherein like reference numerals are employed throughout to identify like parts and components.

DETAILED DESCRIPTION OF THE PREFERRED EMBODIMENT AND PRACTICE

Figure 1:
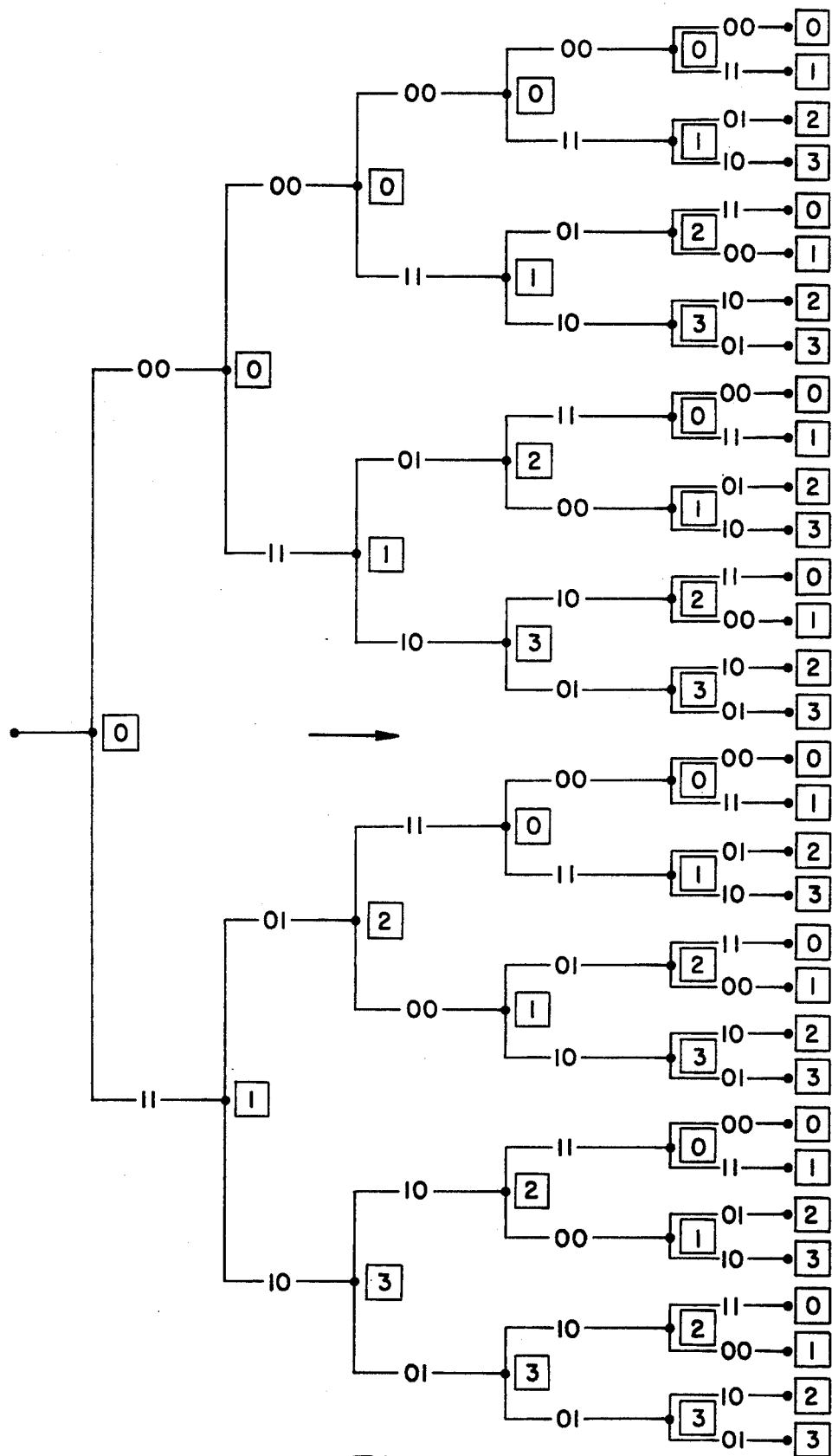
FIG. 1 is a graphic representation of a tree applicable to a known convolutional encoding scheme.
Figure 2:
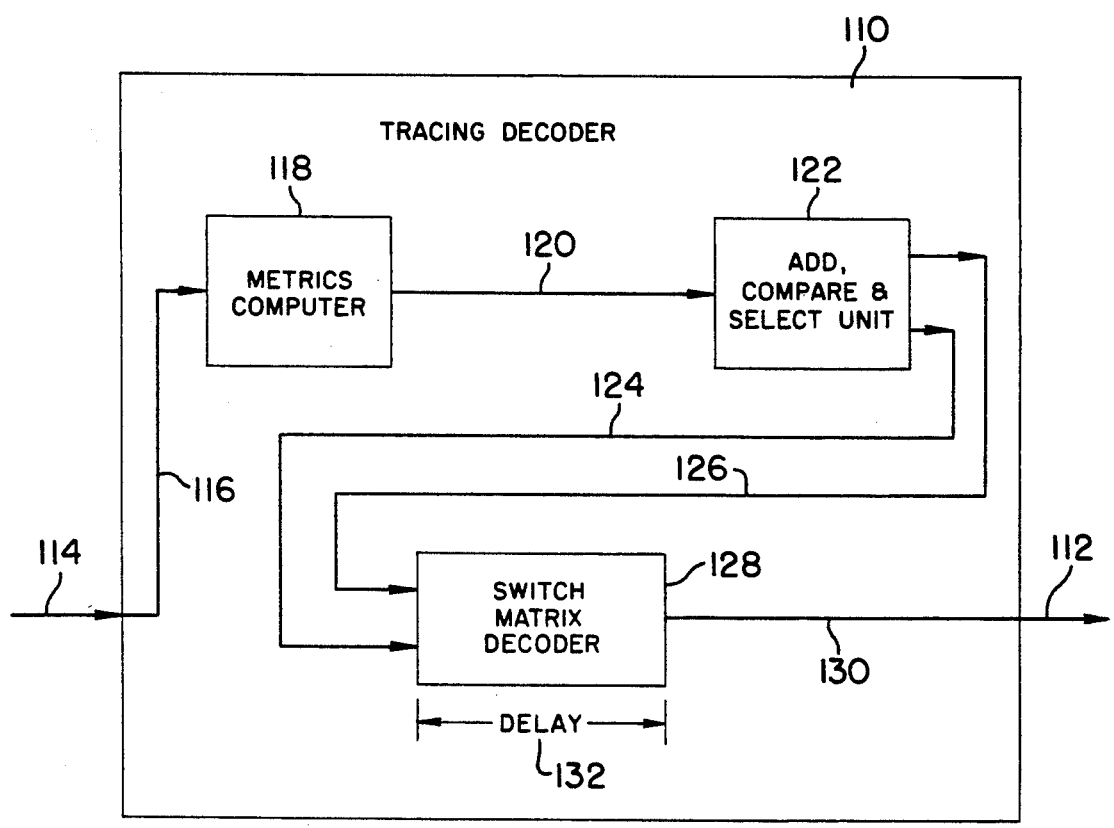
FIG. 2 is a block diagram of a prior art system for convolutional decoding.
Figure 3:
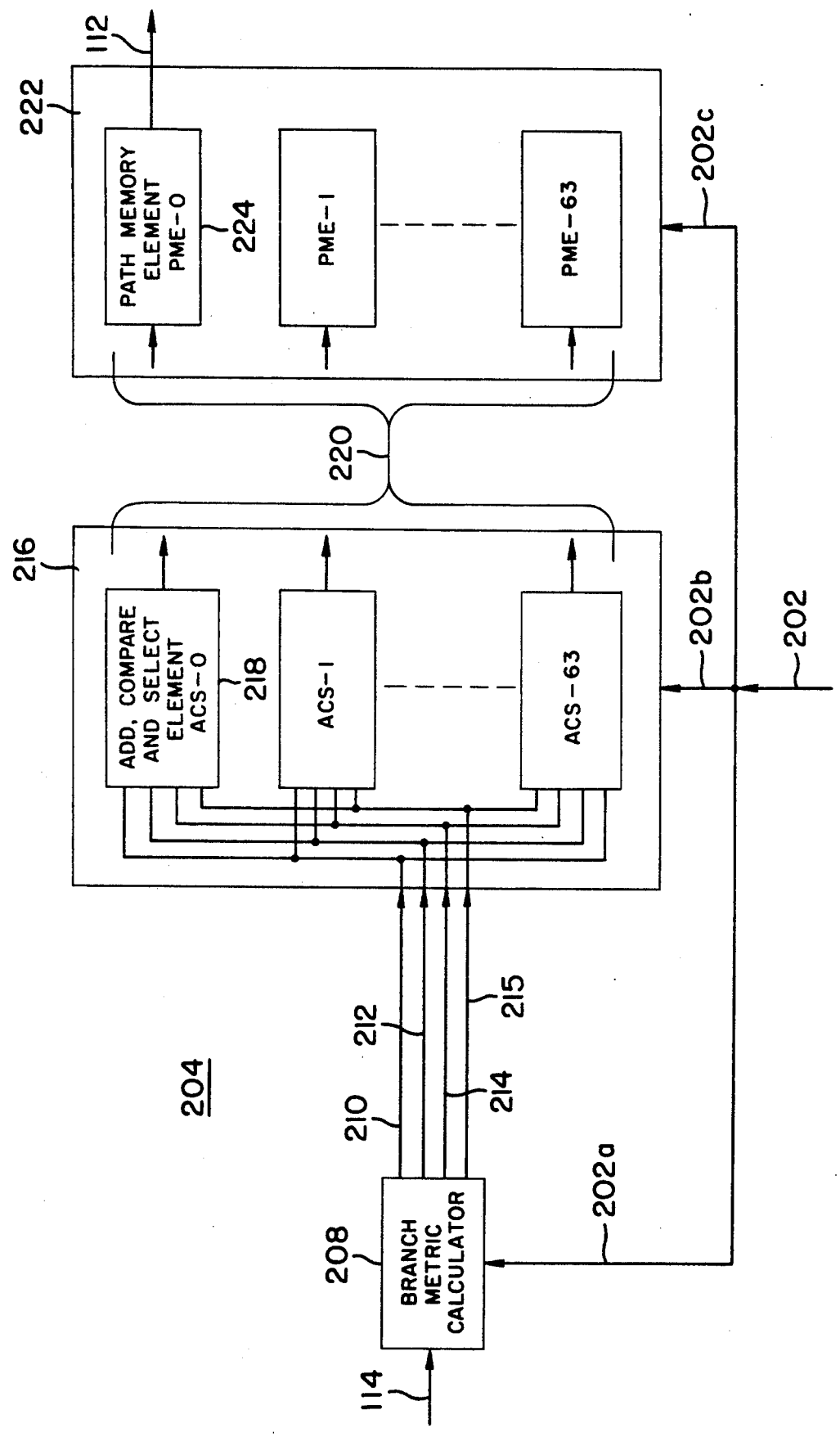
FIG. 3 is a functional block diagram of the non-tracing decoder of the invention.

Referring to FIG. 3, non-tracing decoder 204 of the invention receives input data from line 114, which is connected to branch metric calculator 208. The branch metrics as calculated are applied to lines 210, 212, 214 and 215 and furnished thereby to add, compare and select (ACS) unit 216. This unit computes best state metrics and includes, for a constraint length seven convolutional encoder at the transmitting station, sixty-four ($2^{K-1}$) individual ACS elements denoted as ACS-0, ACS-1, through to ACS-63, the structure of which is discussed in connection with FIG. 4 below.

Each ACS element is responsive to input branch metrics and prior state metrics to determine a best state metric and lines 220 convey such best state metrics decision to path memory unit 222. The ACS elements are interconnected to constitute a trellis by connections noted below in connection with FIG. 5.

Path memory unit 222 is configured, again in the case of the exemplary constraint length seven transmitting encoder, with sixty-four ($2^{K-1}$) individual path memory elements (PME) 224, as are indicated as PME-0, PME-1, through to PME-63. The PME unit yields the decoder output to line 112.

Figure 4:
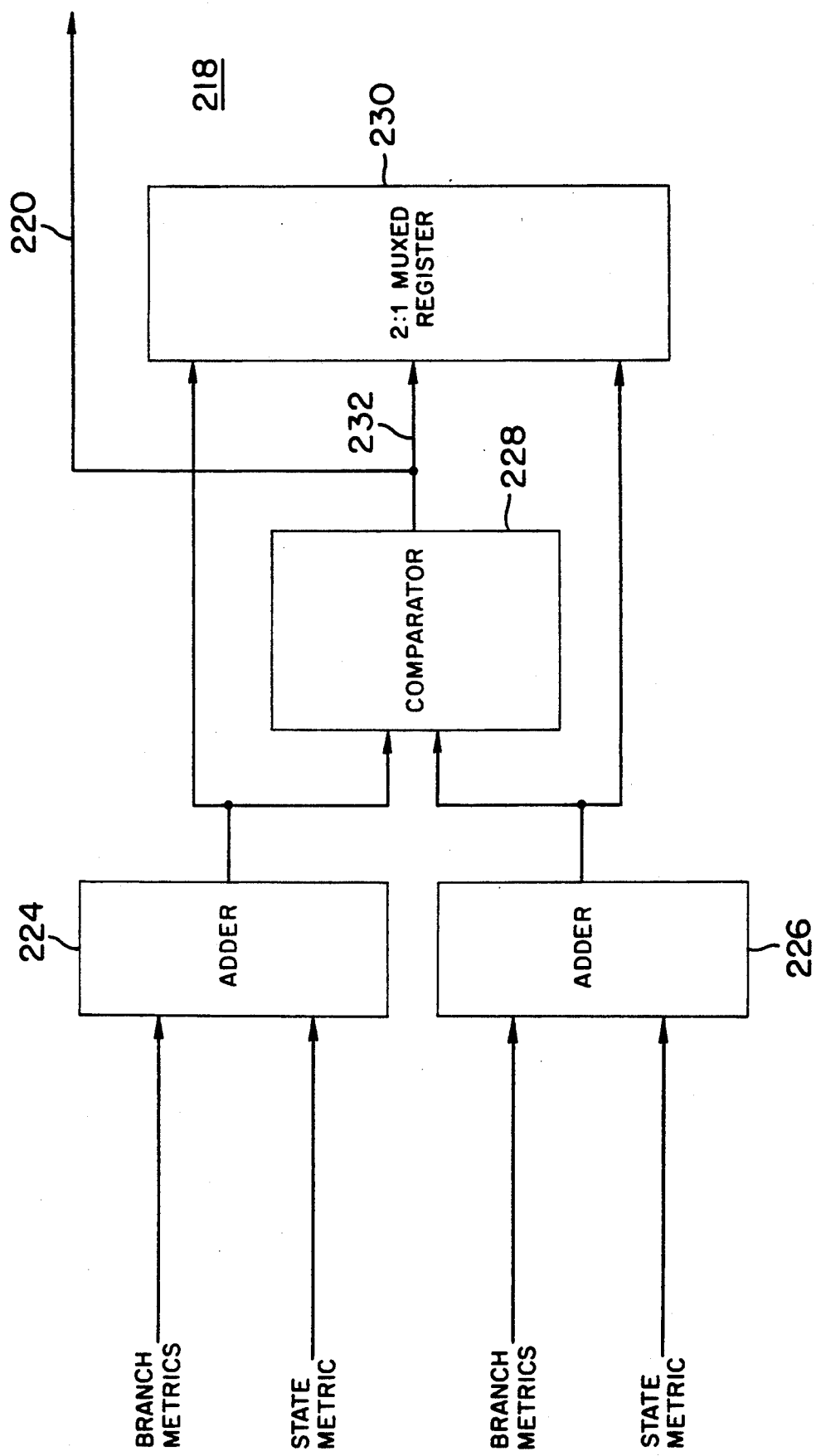
FIG. 4 is a functional block diagram of an individual one of the ACS elements of FIG. 4.

The structure of each ACS element is depicted in FIG. 4. Branch metrics and a state metric are added in adders 224 and 226. The respective sums are compared in comparator 228 and are also applied to 2:1 mutiplexed (MUXED) register 230. In response to the results of the comparison in comparator 228, a signal is provided on line 232 to register 230 which will gate into the register one or the other of the inputs thereto from adders 224 and 226 as the best state metric for subsequent use as the prior state metric. The signal on line 232 is provided also as an output of the ACS element 218 on line 220 as a decision bit for use in path memory unit 222.

Each path memory element is constituted by an L-length 2:1 multiplexed register and has its select input terminal connected to an individual one of lines 220, L being equal to the path memory length. The sixty-four path memory elements are connected, as in the case of the ACS elements, per the connection indications of FIG. 5, to replicate the trellis. Each of the registers of the path memory elements is desirably of path memory length of more than five to six times the constraint length at hand.

On the basis of the line 220 signal, the contents of one or the other of the connected path memory elements are entered in the multiplexer register, with a shift accompanying the entry, outputting the decoded data bit and providing room for entry of the next data bit. This configuration allows an entire path of data to be parallel loaded into another path location while leaving room for the new data bit. This newest databit in the path is always preset to a 1 or 0 and is determined by the encoder in that a given state may only be produced by a consistent input bit. For example, the convolutional transmitting encoder may only be driven into the 00 state by an input bit of zero and into the 01 state by an input bit of one. This repeats throughout the trellis.

Figure 5:
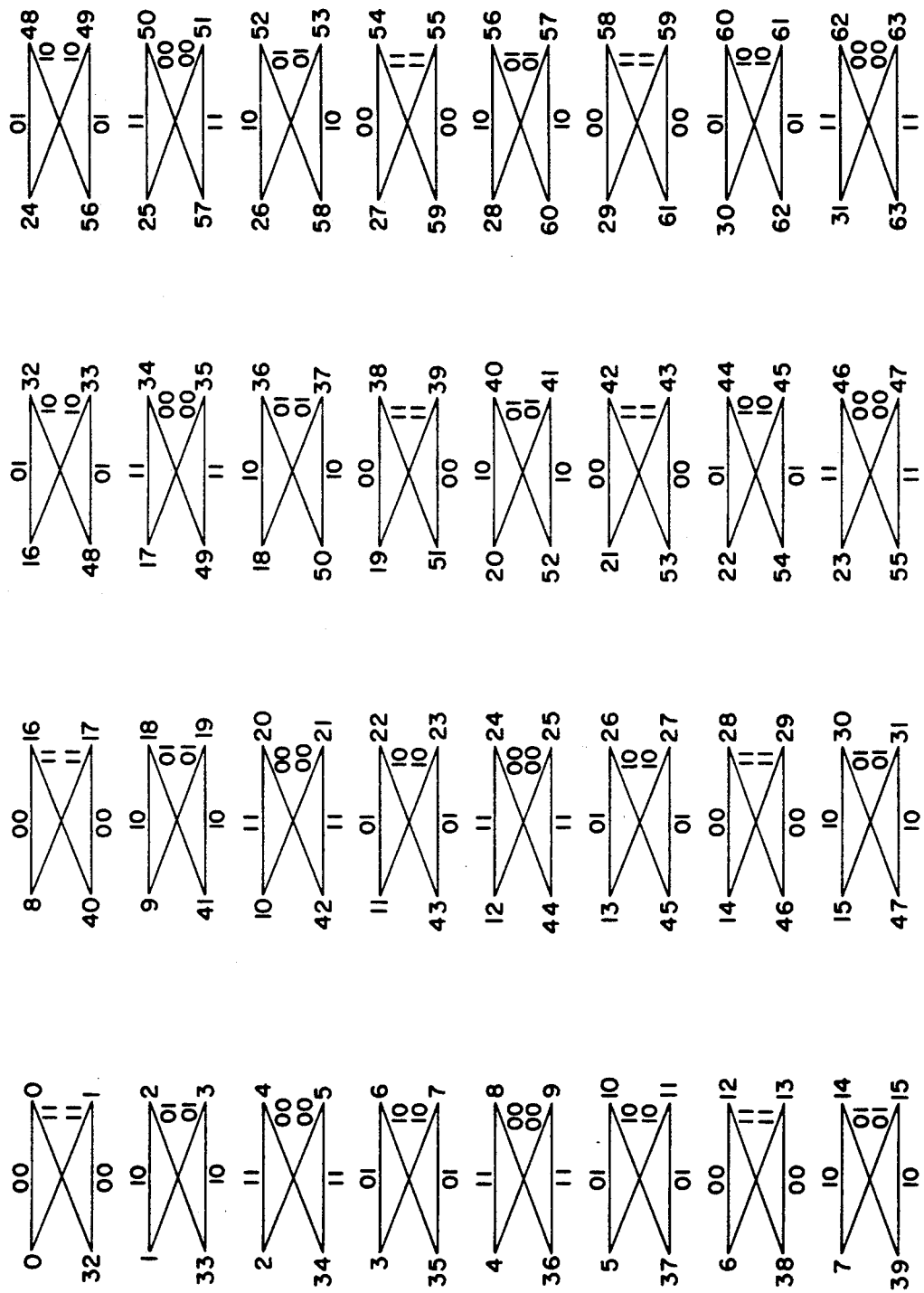
FIG. 5 is a connection diagram indicating the manner in which the ACS elements and path memory elements of FIG. 4 are interconnected.

Referring to FIG. 5, from the connection indications therein, it will be seen that the sixty-four ACS elements are interconnected such that the value stored as the best state metric is fed back to the appropriate input of another ACS element to duplicate the trellis. As noted, the path memory elements are likewise interconnected according to the FIG. 5 indications. Thus, every one path can be derived from one of two other paths. That is, for each path register, two other path register outputs can be chosen to become the surviving path for that leg of the trellis.

Operation of the non-tracing decoder thus described is as follows. In a multiplexing operation, symbol pairs are input to branch metric calculator 208. The branch metrics are accordingly calculated and supplied to the ACS elements, which sum and select the best state metric. The sixty-four select bits from the ACS elements are used to control the path memory multiplexed registers which will choose the surviving data path by parallel loading the selected path memory element. The decoder output is the data bit emerging from the path memory element. Due to the path memory length, each path at this juncture will contain the same data bit and any path register can be chosen as the output data register.

While decoder delay in accordance with the invention is essentially that of prior decoders in respect of metrics calculations, based on trellis interconnection of the memory circuits, the above-discussed propagation delay of the prior art is eliminated and decoder delay is independent of the trellis path length.

While the invention has been illustrated by the use of a rate of one-half, i.e., wherein the encoder provides two code symbols for each message data bit, other rates may evidently be employed as indicated through lines 202, 202a, 202b, and 202c. Also, while the described example involves a constraint length (K) of seven and has sixty-four ACS elements and sixty-four path memory elements, the generic relation applies wherein ACS elements and path memory elements are equal to $2^{K-1}$. For example, for a constraint length of three, a decoder in accordance with the invention will have four ACS elements and four path memory elements.

Various changes may be introduced in the foregoing practices of the invention and in the system embodiments without departing from the invention. Accordingly, the particularly described preferred methods and apparatus are intended in an illustrative and not in a limiting sense. The true spirit and scope of the invention is set forth in the appended claims.

What is claimed is:

1. A convolutional decoder for decoding a received message of digital data convolutionally encoded at a constraint length of K, comprising:
   (a) branch metric calculating means for receiving said digital data and providing output signals indicative of branch metrics therefore;
   (b) a plurality of $2^{K-1}$ parallel circuit means for receiving said output signals form said branch metric calculating means and compounding state metrics, said $2^{K-1}$ parallel circuit means being interconnected to form a trellis and generating decision bits; and
   (c) a plurality of $2^{K-1}$ parallel memory circuits for receiving said decision bits from said plurality of $2^{K-1}$ parallel circuit means, said $2^{K-1}$ parallel memory circuits being interconnected also to form a trellis and responsive to said received decision bits to output a decoded digit of said received message data without traceback into said decoder.

2. The invention claimed in claim 1 wherein each of said $2^{K-1}$ parallel memory circuits has a path length L, L being a multiple of at least five of said constraint length.

3. The invention claimed in claim 2 wherein each said $2^{K-1}$ parallel circuit means comprises a plurality of adding means for addition of selected such computed branch and state metrics and providing an output indicative of such addition, comparator means for comparison of the outputs of said adding means, ad a multiplexed register responsive to a result of the comparison of the outputs of said adding means to store an output of said adding means as a best state metric.

4. The invention claimed in claim 3 wherein each of said $2^{K-1}$ parallel memory circuits comprises a multiplexed register responsive to said decision bit to output said decoded data bit.

5. The invention claimed in claim 2 wherein each of said $2^{K-1}$ parallel memory circuits comprises a multiplexed register responsive to said decision bit to output said decoded data bit.

6. The invention claimed in claim 1 wherein each said $2^{K-1}$ parallel circuit means comprises a plurality of adding means for addition of selected such computed branch and state metrics and providing an output indicative of such addition, comparator means for comparison of the outputs of said adding means, and a multiplexed register responsive to a result of the comparison of the outputs of said adding means to store an output of said adding means as a best state metric.

7. The invention claimed in claim 1 wherein each of said $2^{K-1}$ parallel memory circuits comprises a multiplexed register responsive to said decision bit to output said decoded data bit.

8. A convolutional decoder for decoding a received message of digital data convolutionally encoded, said convolutional decoder comprising:
   (a) branch metric calculating means for receiving said digital data and providing output signals indicative of branch metrics therefor;
   (b) plurality of parallel circuit means for receiving said output signals from said branch metric calculating means and computing state metrics, said parallel circuit means being interconnected to form a trellis and generating decision bits; and
   (c) a plurality of parallel memory circuits for receiving said decision bits from said plurality of parallel circuit means, said parallel memory circuits being interconnected also to form a trellis and responsive to said received decision bits to output a decoded digit of said received message data without traceback through said decoder.

9. The invention claimed in claim 8 wherein each of said parallel memory circuits has a path length L, L begin a multiple of at least five of a constraint length.

10. The invention claimed in claim 9 wherein each said parallel circuit means comprises a plurality of adding means for addition of selected such computed branch and state metrics and providing an output indicative of such addition, comparator means for comparison of the outputs of said adding means, and a multiplexed register responsive to a result of the comparison of the outputs of said adding means to store an output of said adding means as a best state metric.

11. The invention claimed in claim 10 wherein each of said parallel memory circuits comprises a multiplexed register responsive to said decision bit to output said decoded data bit.

12. The invention claimed in claim 9 wherein each of said parallel memory circuits comprises a multiplexed register responsive to said decision bit to output said decoded data bit.

13. The invention claimed in claim 8 wherein each of said parallel circuit means comprises a plurality of adding means for addition of selected such computed branch and state metrics and providing an output indicative of such addition, comparator means for comparison of the outputs of said adding means, and a multiplexed register responsive to a result of the comparison of the outputs of said adding means to store an output of said adding means as a best state metric.

14. The invention claimed in claim 8 wherein each of said parallel memory circuits comprises a multiplexed register responsive to said decision bit to output said decoded data bit.

15. A convolutional decoder for decoding a received message of digital data convolutionally encoded at a constraint length of K, comprising:
   (a) branch metric calculating means for receiving said digital data and providing output signals indicative of branch metrics therefore;
   (b) parallel state metric computing means responsive to said output signals of said branch metric calculating means for generating decisions bits, said parallel state metric computing means being interconnected to form a trellis; and
   (c) parallel memory circuits receiving said decision bits from said parallel state metric computing means and interconnected also to form a trellis and responsive to said receive decision bits to output a decoded digit of said received message data without traceback through said decoder said parallel memory circuits each defining a path length of L, where L is a multiple of five or more of the K constraint length, L being selectable as an integer without introducing tracing propagation delay in operation of the convolutional decoder.

* * * * *